United States Patent
Foss et al.

(10) Patent No.: US 6,888,730 B2
(45) Date of Patent: May 3, 2005

(54) CONTENT ADDRESSABLE MEMORY CELL

(75) Inventors: Richard Foss, Kirkaldy Fife (GB); Charles Taylor, Austin, TX (US); Curtis Richardson, Taylor, TX (US)

(73) Assignee: Mosaid Technologies Incorporated, Kanata (CA)

( * ) Notice: Subject to any disclaimer, the term of this patent is extended or adjusted under 35 U.S.C. 154(b) by 77 days.

(21) Appl. No.: 10/084,619

(22) Filed: Feb. 28, 2002

(65) Prior Publication Data

US 2002/0141218 A1 Oct. 3, 2002

Related U.S. Application Data

(63) Continuation-in-part of application No. 09/894,900, filed on Jun. 29, 2001, now Pat. No. 6,522,562.

(30) Foreign Application Priority Data

Apr. 3, 2001 (CA) ............................................... 2342575

(51) Int. Cl.[7] ............................................... G11C 15/00
(52) U.S. Cl. ......................................... 365/49; 365/168
(58) Field of Search ............................. 365/49, 189.07, 365/52, 104, 168, 174, 180, 154

(56) References Cited

U.S. PATENT DOCUMENTS

| | | | |
|---|---|---|---|
| 5,699,288 A | 12/1997 | Singh et al. | |
| 6,108,227 A | 8/2000 | Voelkel | |
| 6,154,384 A | 11/2000 | Nataraj et al. | |
| 6,188,594 B1 | 2/2001 | Ong | |
| 6,195,278 B1 * | 2/2001 | Calin et al. | 365/49 |
| 6,219,271 B1 | 4/2001 | Ishida | |
| 6,240,004 B1 * | 5/2001 | Kuo et al. | 365/49 |
| 6,263,400 B1 * | 7/2001 | Rangasayee et al. | 365/49 |
| 6,320,777 B1 | 11/2001 | Lines et al. | |
| 6,333,254 B1 | 12/2001 | Abbott et al. | |
| 6,339,241 B1 | 1/2002 | Mandelman et al. | |
| 6,362,993 B1 * | 3/2002 | Henderson et al. | 365/49 |
| 6,370,052 B1 * | 4/2002 | Hsu et al. | 365/49 |

FOREIGN PATENT DOCUMENTS

| | | |
|---|---|---|
| EP | 1 187 142 A1 | 3/2002 |
| JP | 2000223591 A | 8/2000 |

* cited by examiner

*Primary Examiner*—Thong Q. Le
(74) *Attorney, Agent, or Firm*—Dowell & Dowell, P.C.

(57) ABSTRACT

A content addressable memory (CAM) having a plurality of ternary memory cells, each ternary half cell comprising an equal number of transistors of a p-type and an n-type, the p-type transistors being formed in a first well region and the n-type transistors being formed in a second well region, the wells having at most one p+ to n+ region spacing, the transistors being interconnected to form the half ternary CAM cell and wherein the interconnections for the cell is restricted to a silicon layer and a first metal layer and connections between said cell and external signal lines is restricted to at least a second metal layer.

7 Claims, 11 Drawing Sheets

CONTENT ADDRESSABLE MEMORY CELL

This application is a Continuation-In-Part Application from U.S. application Ser. No. 09/894,900, filed Jun. 29, 2001, now U.S. Pat. 6522562 which claims priority from Canadian Application Serial No. 2,342,575, filed Apr. 3, 2001

BACKGROUND OF THE INVENTION

Conventional content addressable memories (CAMs) are implemented primarily using static random access memory (SRAM) cells. SRAM-based CAMs have received widespread use due to the high access speed of SRAM memory cells and the static nature of the cells. Furthermore, SRAM cells can be manufactured using a pure-logic type fabrication process, which is commonly used for non-memory circuit blocks.

In addition to random access memory (RAM) functions of writing and storing data, the CAM also searches and compares the stored data to determine if the data matches search data applied to the memory. When the newly applied search data matches the data already stored in the memory, a match result is indicated, whereas if the search and stored data do not match, a mismatch result is indicated. CAMs are particularly useful for fully associative memories such as look-up tables and memory-management units.

Many current applications utilise ternary CAMS, which are capable of storing three logic states. For example, the three logic states are logic '0', logic '1' and "don't care". Therefore, such CAM cells require two memory cells to store the logic states, as well as a comparison circuit for comparing stored data with search data provided to the CAM.

In ternary form, each conventional SRAM-based CAM memory cell comprises a regular six-transistor (6T) SRAM cells. Therefore, SRAM-based CAM cells typically use 12 transistors to implement two 6T SRAM cells. That is, each SRAM cell requires 2 p-channel transistors and 2 n-channel transistors in a cross-coupled inverter relationship and a further 2 n-channel transistors as access devices from the bit lines.

Furthermore, four additional transistors are required for each ternary CAM memory cell for implementing an exclusive-NOR function for comparing the search data with the stored data. For ternary CAM cells, n-channel devices are typically used in the comparison circuit.

Some approaches in the art store data in a main memory cell and mask data in a mask memory cell. The comparison circuit is then either enabled or disabled by the mask memory cell contents. Examples of memory cells implementing such an approach are illustrated by U.S. Pat. No. 6,154,384, issued to Nataraj et al. and U.S. Pat. No. 6,108,227 issued to Voelkel. Although this approach is functional from a circuit point of view, difficulty arises when attempting to layout the elements of the CAM cells. The main problem is a non-optimised layout of the CAM cell, which takes up more silicon area than desired.

DRAM-based CAMs have also been proposed in the art DRAM cells are typically physically smaller tan SRAM cells. Therefore, DRAM-based CAMs have the advantage of being able to store much more data than SRAM-based CAMs for a given area due to the much smaller CAM cell size. However, because of the dynamic nature of the DRAM cell, which is used to implement a DRAM-based CAM cell, such cells require regular refresh operations in order to maintain the data, and such refresh circuitry take up additional silicon area.

U.S. Pat. No. 6,188,594 issued to Ong describes a CAM cell using only n-channel transistors. The CAM cell uses only n-channel transistors. The size of the cell is significantly reduced since the p-channel transistors are eliminated. The cell size is fiber reduced by using dynamic storage rather than static storage in the CAM cell. The dynamic CAM cell as described has as few as six transistors, and a compact layout is facilitated. However, as previously mentioned, dynamic cells require additional refresh circuitry.

Therefore, there is a need for an SRAM-based CAM cell that achieves a more efficient spatial layout than the prior art, while maintaining the static characteristic of the SRAM-based CAM cell.

SUMMARY OF THE INVENTION

In accordance with an aspect of the invention, there is provided a content addressable memory (CAM) having a plurality of ternary memory cells fabricated in a semiconductor material, each ternary half cell comprising:

an equal number of transistors of a p-type and an n-type, the p-type transistors being formed in an n-well region and the n-type transistors being formed in an p-well region of said semiconductor material, the wells having at most one p+ to n+ region spacing, the transistors being interconnected to form the half ternary CAM cell and wherein The transistor interconnections are formed in a first group of layers and connections between the half ternary cam cell and signal lines external to the cell are formed in a second group of layers.

DETAILED DESCRIPTION OF THE PREFERRED EMBODIMENT

Figure 5:
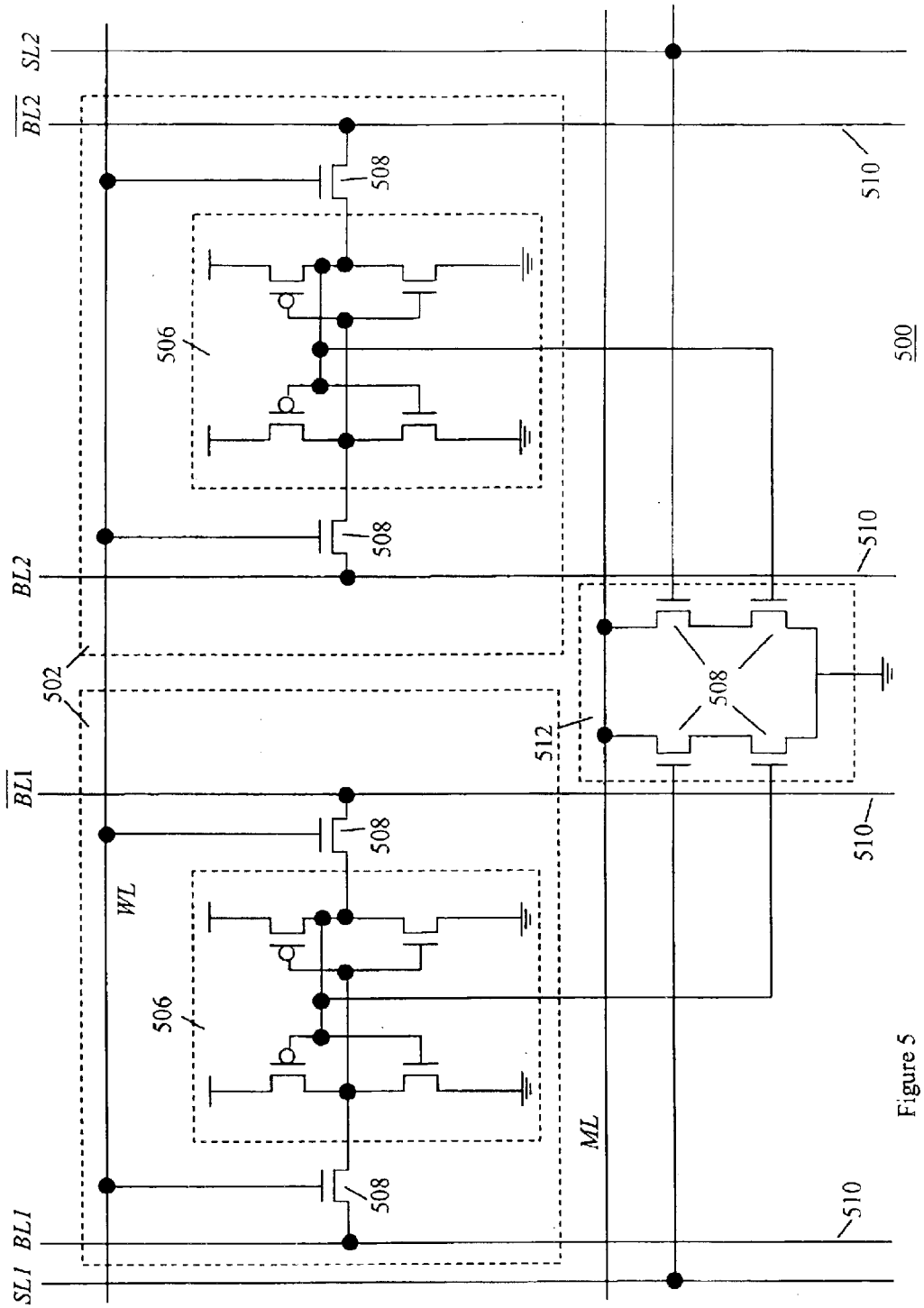
FIG. 5 is a circuit diagram of a fall ternary SRAM-based CAM cell according to the prior art.

Referring to FIG. 5, an SRAM-based CAM cell that is standard in the art is illustrated generally by numeral 500. The CAM cell comprises two 6T SRAM cells 502. Each SRAM cell 502 comprises two p-channel transistors and two n-channel transistors in a cross-coupled inverter relationship 506, and a further two n-channel transistors 508 as access devices from a pair of bit lines 510. The CAM cell further comprises a comparison circuit 512 with four additional n-channel transistors 508 for implementing an exclusive-NOR function for comparing search data with stored data.

The main problem with the implementation illustrated in FIG. 5 is an imbalance between the number of transistor types, which leads to a non-optimised layout of the CAM cell. Specifically, out of the total of 16 transistors, only four are p-channel devices. Moreover, all n-channel devices in a cell need to be positioned in a common p diffusion region. This region includes the n-channel access devices 508, the a-channels of the cross-coupled inverters 506 and the n-channels of the comparison circuit 512. The inevitable result is an unbalanced layout with regions containing The n-channels highly congested and wasted space around the two remaining p-channels used for the pull-up devices in the cross-coupled inverter transistors 504.

It is a well-known design layout rule in the industry that n+ to p+ spacing is usually large relative to other design rules in a typical CMOS fabrication process. Also, the n+ to p+ spacing cannot contain transistors therein. Therefore, the aspect ratio of The cell should be made narrow. That is, the smaller dimension of a typical cell is in the direction of the line of the p-well separating n-channels and p-channels in the cell array. This minimises The area wasted in the p+ to n+ spacing. However, this is difficult to achieve given the imbalance between n-type and p-type devices in the conventional approach.

A reduction in ternary CAM cell area and optimization of a CAM cell layout is achieved by replacing n-channel access devices used for the SRAM cells with p-channel access devices and providing an active logic '0' activated word line instead of an active logic '1' activated word line. An SRAM cell with p-channel access devices is not normally used in conventional commodity or embedded SRAM applications due to the speed advantage of switching n-channel devices over p-channel devices. In a regular SRAM memory, the switching speed and other characteristics would suffer as a result. However, in a CAM cell, performance of the read/write is less critical than in a conventional SRAM cell since the primary task a CAM memory performs on a regular basis is a search and compare function.

Using p-channel access devices instead of n-channel access devices results in a full ternary CAM cell with a more balanced number of p-channel transistors and n-channel transistors. It is further preferable that the devices are balanced such that 8 n-channel devices and 8 p-channel devices are used in The layout.

Figure 1:
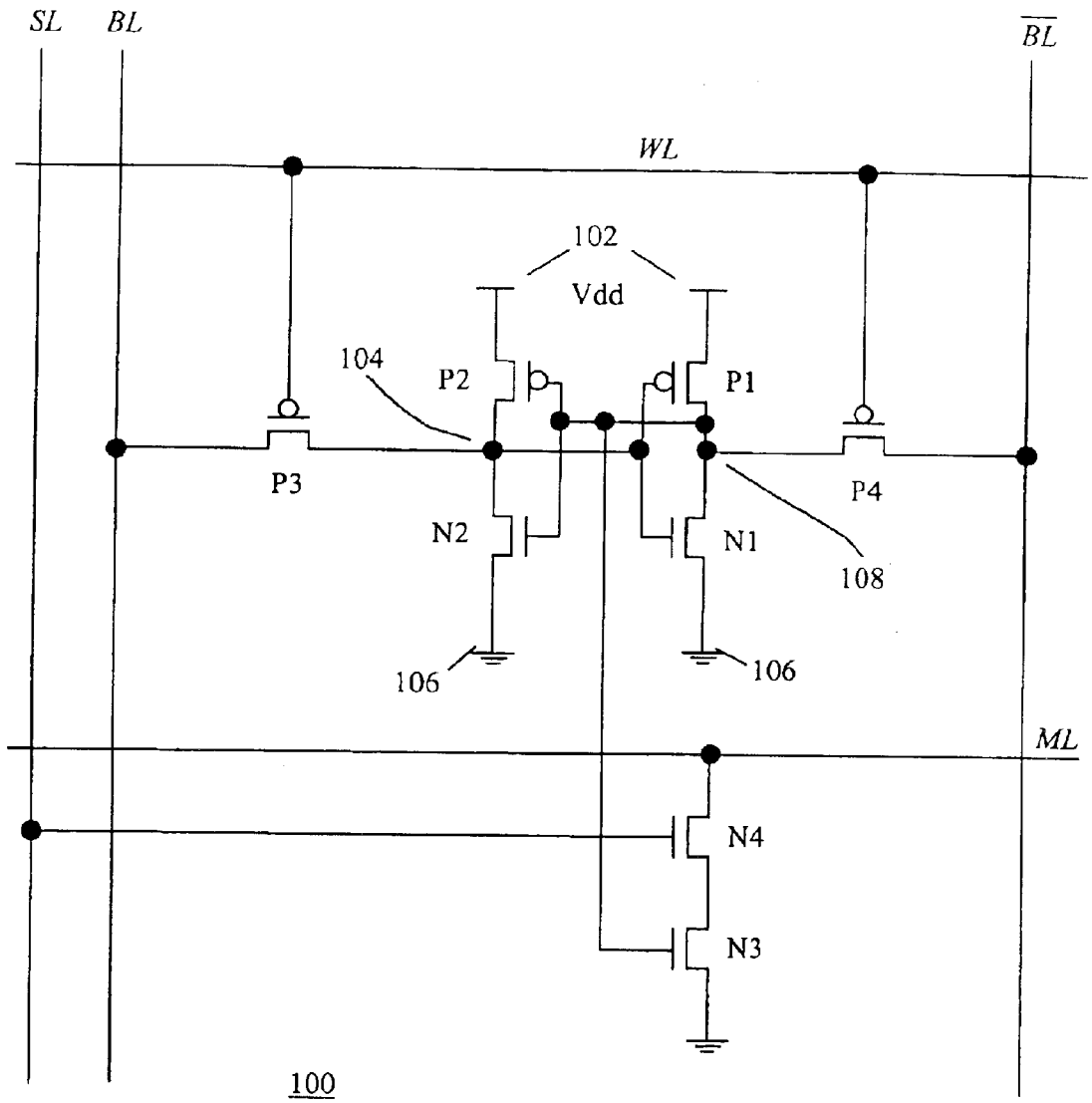
FIG. 1 is a circuit diagram of a ternary CAM half-cell according to an embodiment of the invention.

Referring to FIG. 1, a CAM half-cell in accordance with an embodiment of the invention is illustrated generally by numeral 100. The half-cell 100 comprises a complimentary bit line pair BL and $\overline{BL}$, a word line WL, a search line SL, a match line ML, cross-coupled inverter transistors P1, N1, P2, and N2 and p-channel access devices P3 and P4.

P2 is coupled between a positive supply voltage 102 and a first node 104. N2 is coupled between the first node 104 and a ground supply voltage 106. Both P2 and N2 are gated by a second node 108. P1 is coupled between a positive supply voltage 102 and the second node 108. N1 is coupled between the second node 108 and a ground supply voltage 106. Both P1 and N1 are gated by the first node 104.

The first node 104 is coupled to bit line BL via access transistor P3. P3 is gated by the word line WL, The second node 108 is couple to bit line $\overline{BL}$ via access transistor P4. P4 is also gated by the word line WL. The p-channel access devices P3 and P4 selectively connect the cross-coupled inverters to complementary bit lines BL and $\overline{BL}$ which carry read/write data.

The match line ML is coupled to ground via serially coupled transistors N3 and N4. N4 is gated by the search line SL and N3 is gated by the second node 108. As can be seen from FIG. 1, there are four p-channel transistors and four n-channel transistors comprising the half-cell as opposed to two p-channel transistors and six n-channel transistors as discussed regarding the prior art approach.

Figure 2:
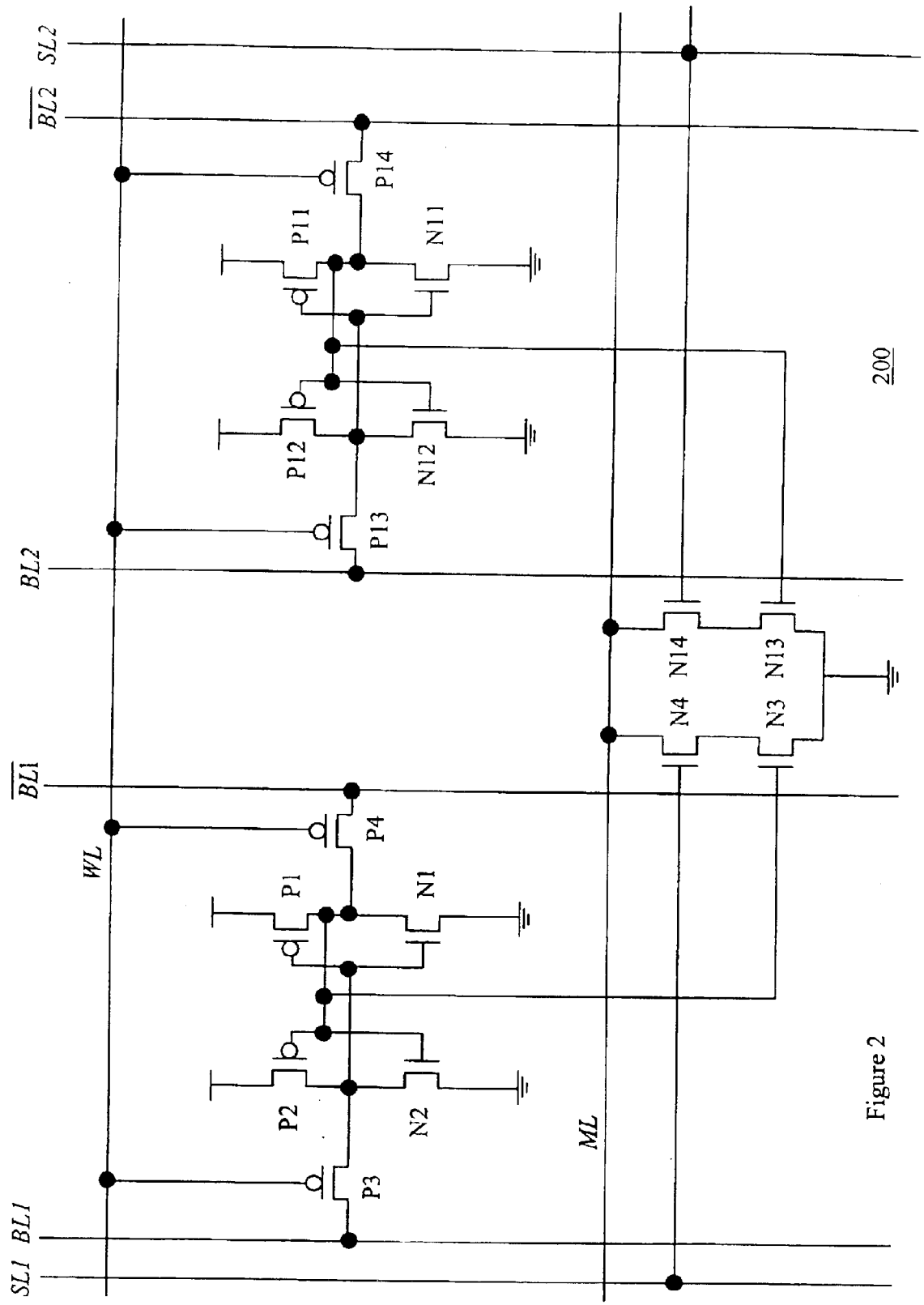
FIG. 2 is a circuit diagram of a full ternary SRAM-based CAM cell according to a first embodiment of the invention.

Referring to FIG. 2 a full ternary CAM cell in accordance with an embodiment of the present invention is illustrated generally by numeral 200. The fill ternary CAM cell comprises 8 p-channel transistors and 8 n-channel transistors. The transistors of the first SRAM cell component of the full ternary CAM cell are numbered similarly to the corresponding transistors in FIG. 1 for convenience. For the second SRAM cell component of the CAM cell, the cross-coupled inverter transistors are labelled P12, N12, P11 and N11, the access transistors are labelled P13 and P14, and the transistors serially coupled between the match line ML and ground are labelled N14 and N13 respectively. It will be noted that for a full ternary CAM cell there are two complementary bit line pairs, BL1, $\overline{BL1}$ and BL2, $\overline{BL2}$ and two search lines SL1 and SL2.

The general operation of the full ternary CAM cell 200 illustrated in FIG. 2 is now described. To perform a write operation, data to be stored in the CAM cell is loaded onto bit line pairs BL1, $\overline{BL1}$, and BL2, $\overline{BL2}$. The word line WL is asserted active logic '0' turning on p-channel access transistors P3, P4, P13 and P14. The data carried on the complementary bit line pairs is thereby written into the two SRAM cells and the word line is de-asserted.

For a read operation, the complementary bit line pairs are precharged to VDD/2. The word line is asserted active logic '0' and the data from the SRAM cells is read onto the bit line pairs. The data then is transferred to data buses (not shown).

For a search and compare operation, the match line is precharged to logic '1' and data is placed on the search lines SL1 and SL2. Typically, search data and stored data are provided in such a manner that in the case of a mismatch a change occurs in the match line state. It is preferable to change the match line state for a mismatch rather than a match because a mismatch is a more infrequent occurrence. Therefore, a change in match line state will occur infrequently, reducing power dissipated by discharging match lines. The match line ML is precharged to a logic '1' and a mismatch discharges the match line to ground, whereas in the case of a match no change occurs in the state of the match line. Alternatively, in another match line sensing approach, the match line is precharged to logic '0' and detection of a match is made by pulling up with a device that is weaker Than the two series devices holding the match line at logic '0'.

If the CAM cell 200 stores a logic '1' in the left SRAM cell and a logic '0' in the right SRAM cell, SL1 has logic '1', and SL2 has logic '0', a mismatch will result as follows. The output of the left SRAM cell provides a logic '1' to transistor N3, turning it on The search line SL1 provides a logic '1' to transistor N4, turning it on. Since N3 and N4 are both turned on, they provide a path to discharge the match line ML ground and thus indicate a mismatch.

If the CAM cell stores a logic '0' in the left SRAM cell and a logic '1' in the right SRAM cell, a match condition will result as follows. The output of the left SRAM cell provides a logic '0' to the gate of transistor N3, leaving it turned off. The search line SL1 provides a logic '1' to the gate of transistor N4, turning it on. However, since N3 and N4 are serially connected, a path to ground does not exist for discharging the match line ML to ground. Similarly, the right SRAM cell provides a logic '1' to transistor N13, turning it on. The search line SL2 provides a logic '0' to transistor N14, leaving it turned off. Therefore, similarly to the left SRAM cell, transistors N13 and N14 do not provide a path to discharge the match line ML to ground. As a result, the match line remains precharged to logic '1' indicating a match condition.

If the CAM cell stores a logic '0' in both the right and left SRAM cells a "don't care" state exists. The output from each SRAM cell produces a logic '0'. The logic '0' is provided to the gate of transistors N3 and N13, ensuring that a match condition is detected regardless of the data provided on the search lines SL1, SL2, and the match line remains unchanged.

This description of the basic operation only covers one possible match line detection scheme. However other approaches, including those common in the art as well as proprietary approaches, may be implemented without departing from the scope of the invention.

Figure 3:
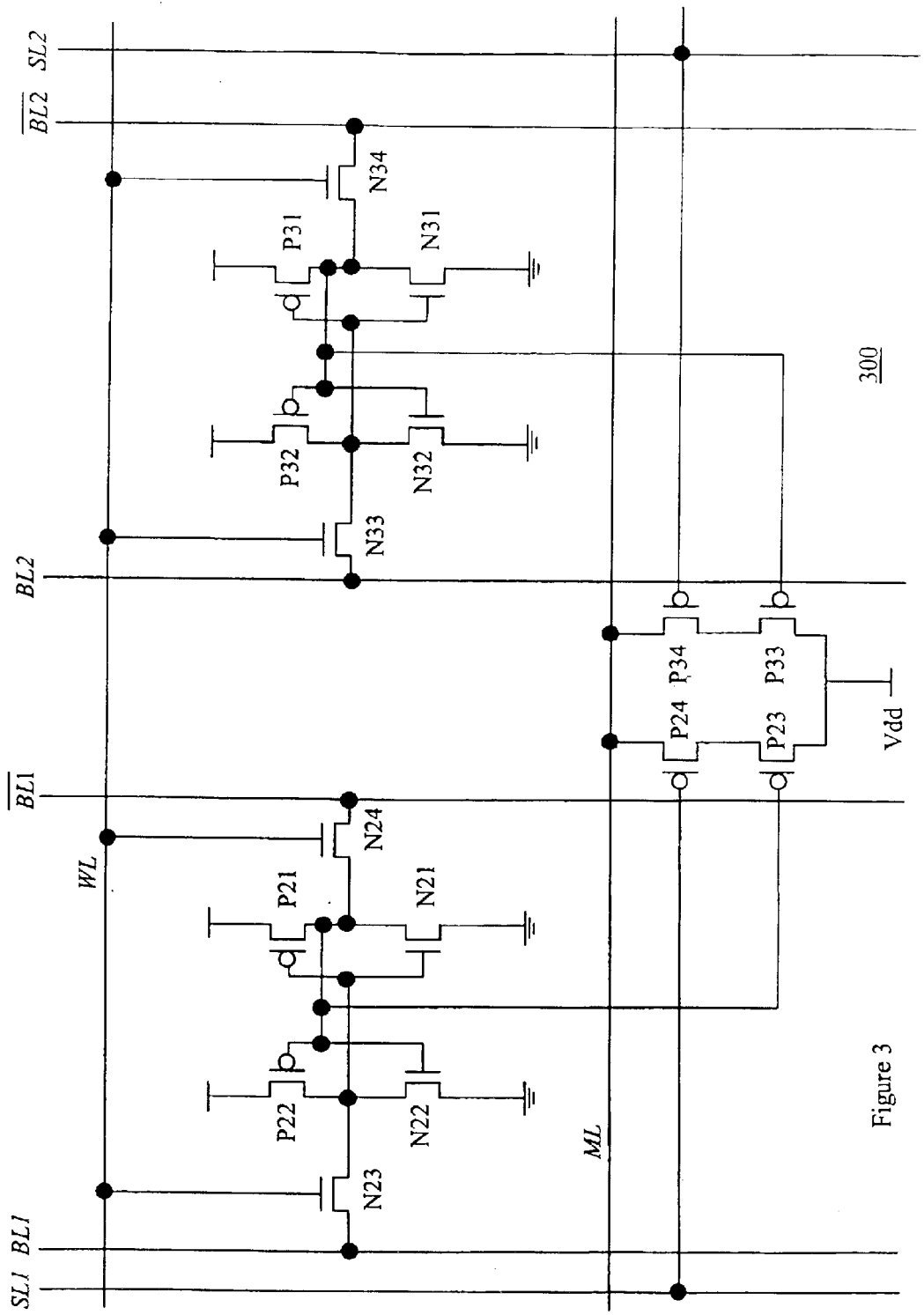
FIG. 3 is a circuit diagram of a full ternary SRAM-based CAM cell according to a second embodiment of the invention.

Referring to FIG. 3, an alternate embodiment of the invention is illustrated generally by numeral 300. In the present embodiment, access devices of the SRAM cells N23, N24, N33, N34 are n-channel devices and the transistors of the comparison circuit P23, P24, P33, P34 are p-channel devices. The operation is similar to the operation of the embodiment illustrated in FIG. 2 with the appropriate voltages reversed for devices of different polarities, as will be apparent to a person skilled in the art. For example, the word line WL is asserted active logic '1'. Further, the match line ML is logic '0' and a mismatch charges the match line ML to logic '1'.

Figure 4:
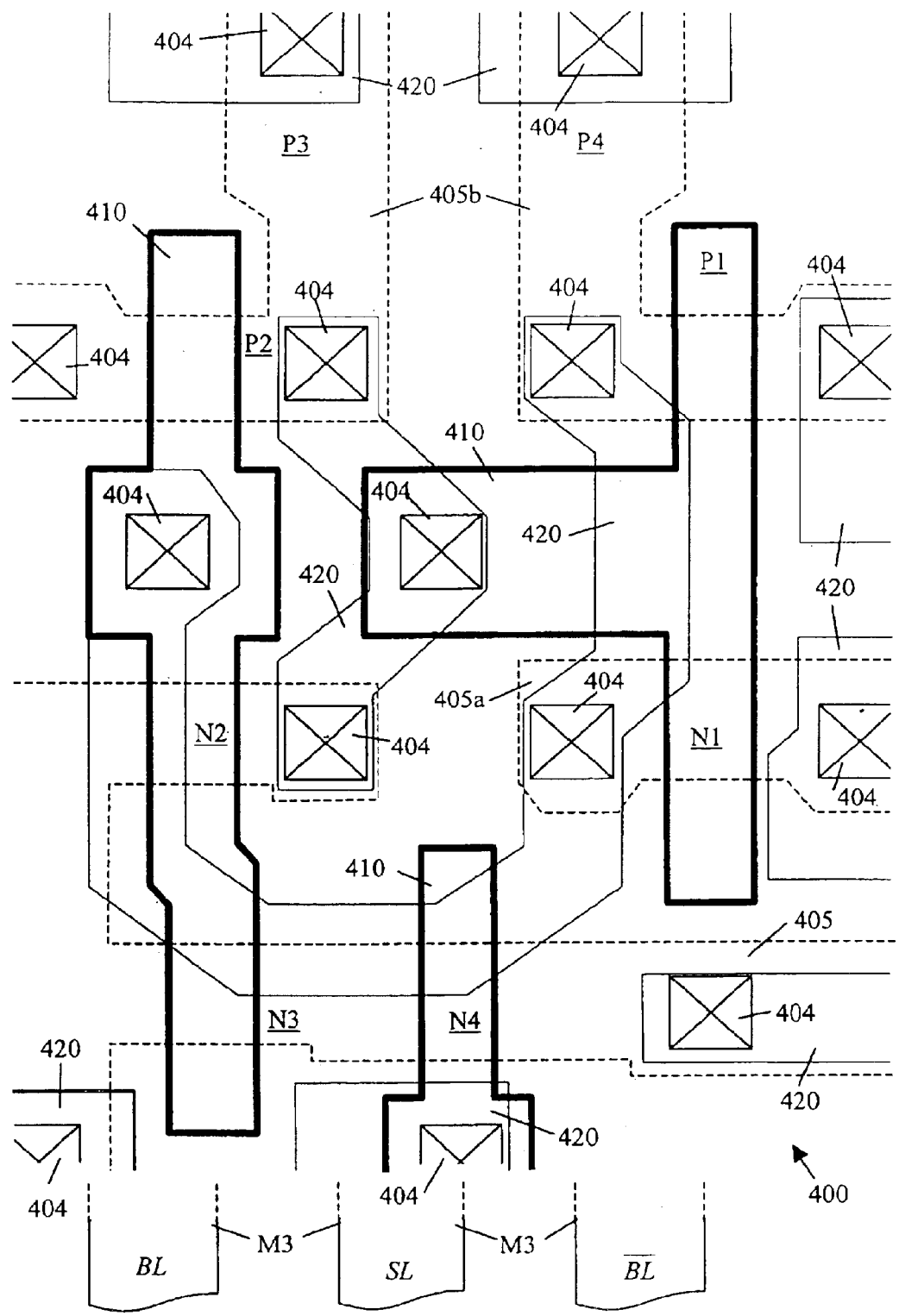
FIG. 4 is a plan view of a half-cell layout corresponding to Circuit in FIG. 1.

Referring to FIG. 4, a layout of a ternary CAM half-cell in accordance with the present embodiment is illustrated generally by numeral 400. The layout 400 corresponds to the circuit 100 illustrated in FIG. 1. For convenience, the transistor labels given to the circuit of FIG. 1, that is P1, P2, P3, P4, N1, N2, N3, and N4, are used for indicating corresponding structures in the layout 400. In the layout 400, broken lines enclose regions representing active semiconductor areas 405 (for example, diffusion or ion-implanted areas). These areas include p-type active regions 405*a* and n-type active regions 405*b*. Thick, solid, continuous lines enclose a poly-silicon layer 410 while thin solid continuous lines enclose a metal 1 layer 420. The metal 1 layer 420 provides a metal interconnect between a plurality of metal contacts 404. The metal contacts 404 are represented by squares with an X symbol therein. Of special note is the metal 1 layer 420 connection for the cross coupled inverters formed by P2, N2, and P1, N1. Other higher metal layers (there are typically several metal layers) are not illustrated for simplicity. These include the search lines SL, complementary bit lines BL and $\overline{BL}$, which are in a third metal M3 layer. These and other layers will be apparent to a person skilled in the art.

As can be seen in FIG. 4 the p-channel devices P1, P2, P3, and P4 are grouped at the top of the figure, using a single n-well, while The n-channel devices N1, N2, N3, and N4 are grouped at the bottom, using a single p-well, This grouping results in a well-balanced use of cell area. Further, the compare circuitry N3 and N4 is separated spatially from the access devices P3 and P4, which yields a well-packed efficient layout with a desirably narrow aspect ratio. As such, only one p+ region to n+ region separation is necessary for the entire cell unlike prior art approaches which required at least two p+ region to n+ region separations. Further advantages of the layout described above include having the connections to the search transistors (N3, N4) at the opposite end of the connections to the access transistors (P3, P4). This separation eases congestion in the upper layers of metal. Furthermore, the cell is close to the minimum width set by transistor geometries, local interconnect (or metal 1), and upper metals simultaneously.

A minimal width and improved aspect ratio mean smaller area and reduced match line length, which is important to increasing speed and reducing power consumption. Analysis reports demonstrate that prior art approaches using a 0.13 um pure logic process utilise a cell size that is approximately 40% larger than a cell implemented using a layout in accordance with the present invention.

Referring now to FIGS. 6*a*, 6*b*, 6*c*, 6*d* and 6*e*, there is shown respective layers of a mock layout for half The ternary CAM cell circuit 300 of FIG. 3. As the layout corresponds to the circuit 300 illustrated in FIG. 3, the specific descriptions of the functions performed by parts of the circuit 300 are omitted Also, for convenience, the same labels, P22, P21, P24, P23, N21–N24 are used to indicate corresponding structures in the layout.

Figure 6A:
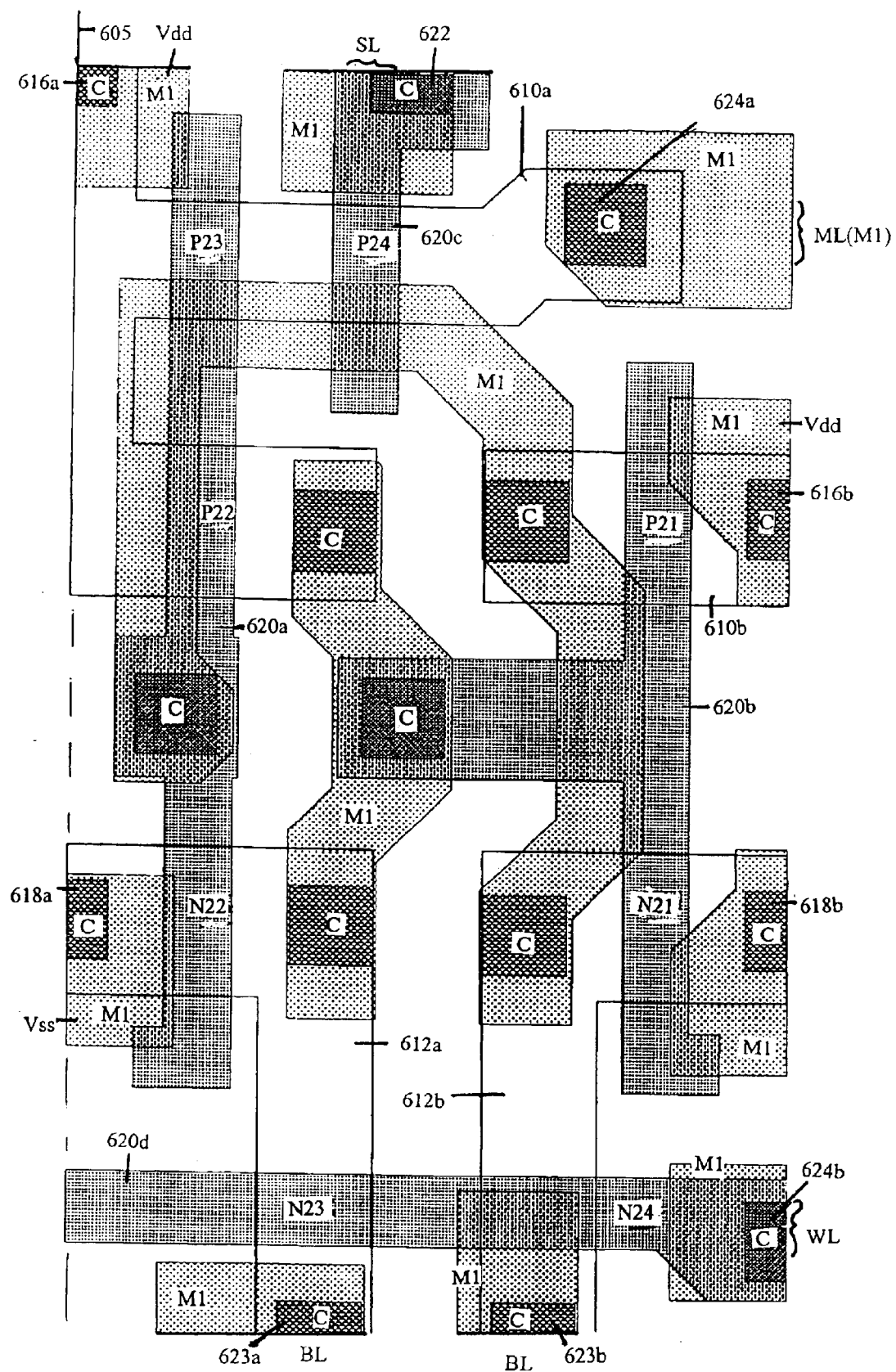
FIGS. 6(a), (b), (c), (d) and (e) show respective layers of layout of a mock layout of the ternary half cell of FIG. 3
Figure 6B:
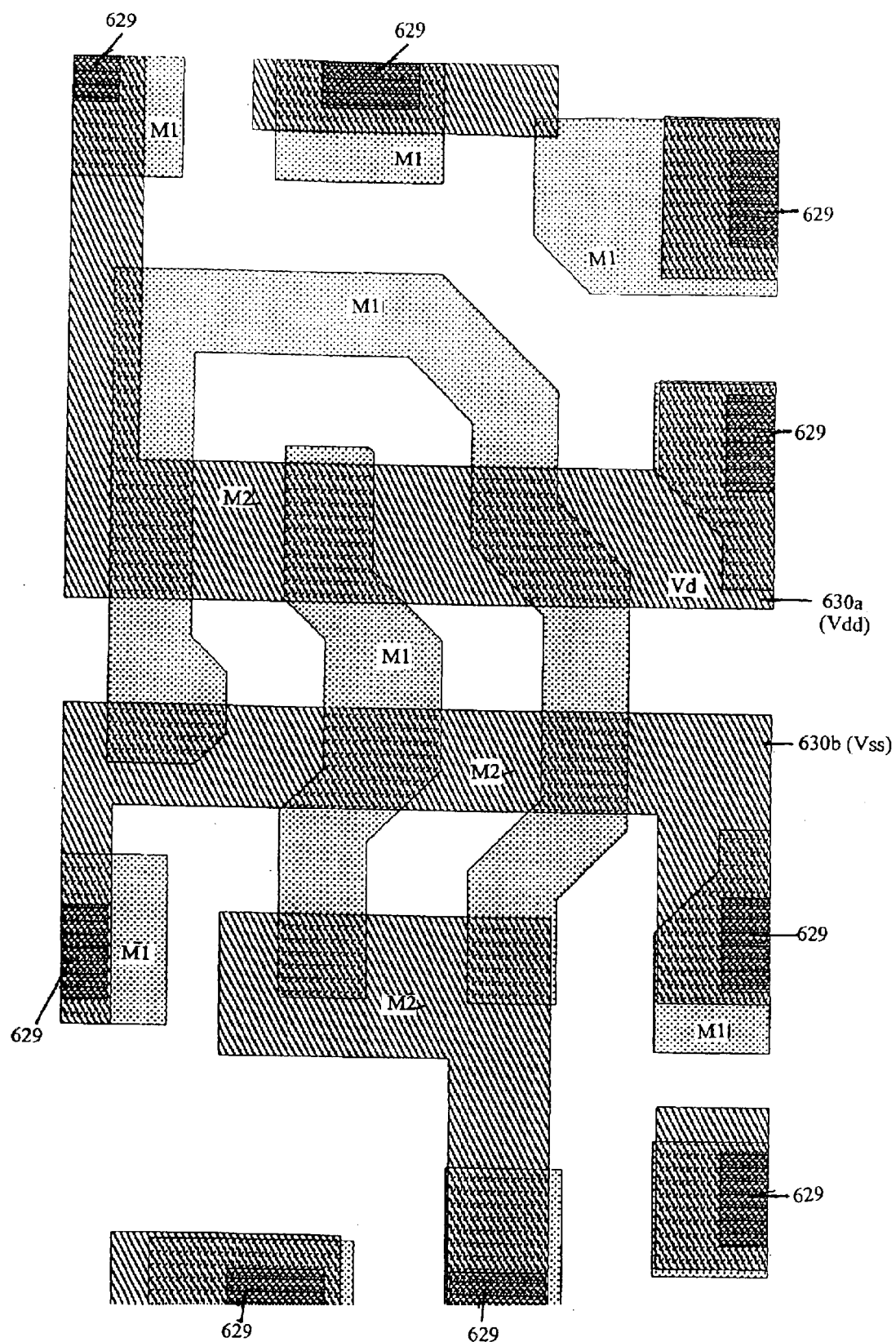

More specifically, FIG. 6*a* illustrates regions of a silicon diffusion layer, a poly-silicon layer and a first metal layer M1; FIG. 6*b* shows second metal layer M2 overlaying layer M1; FIG. 6(*c*) shows a third metal layer M3 overlaying the layer M2; FIG. 6(*d*) shows a fourth metal layer M4 overlaying the layer M3 and FIG. 6(*e*) shows a fifth metal layer M5 overlaid on layer M4.

Referring back to FIG. 6*a*, the half cell 300 includes P-diffusion regions 610*a* and 610*b* and N-type diffusion regions 612*a* and 612*b*, illustrated by regions enclosed with thick lines. The P-diffusion regions are U-shaped with regions 610*a* and 610*b* being separated. The N-diffusion regions 612*a*, 612*b* form a pair of outwardly turned L-shaped regions. The transistors P22–P24 are formed in the P-diffusion region 610*a*, while the transistor P21 is formed in the P-diffusion region 610*b*. The pair of drive transistors N22, N21 and their associated access transistors N23 and N24 are formed in the N-diffusion regions 612*a*, 612*b*, respectively. As may be seen, the P-diffusion region is created in the upper half of the layout while the N-diffusion region is separated from and created in the lower half of the layout. A mirror image (not shown) of the other half of the ternary cell 300 is repeated on the left side of the line of symmetry 605.

The respective gate electrodes of the transistors are formed by a layer of poly-silicon, indicated in FIG. 6*a* by a thick, continuous line enclosing dark stippled regions 620*a*, 620*b*, 620*c* and 620*d*. The poly-silicon layer 620*a* forms the gates of transistors P23, P22 and N22. Poly-silicon layer 620*d* forms the gates of transistors N23 and N24, poly-silicon layer 620*c* forms the gate of P24 and poly-silicon layer 620*b* forms the gates of P21 and N21.

The interconnection between the various transistors is accomplished in the first metal layer M1, indicated by lightly stippled regions. This metal layer M1 is laid over the poly-silicon layer 620. Interconnection between the diffusion or poly-silicon layers and the metal 1 layer M1 is achieved by metal 1 contacts, represented by cross-hatched rectangles.

The connection of the half ternary CAM cell to signal lines external to the cell such as match line ML, bit lines BL and BL, search line SL, word line WL and supply lines VDD, VSS are achieved by interconnects made through contacts formed in the metal layer M1 and subsequent upper metal layers illustrated in FIGS. 6*b* to 6*e* described in more detail below.

Accordingly, referring back to FIG. 6*a*, contacts formed in the metal layer M1 may be described as follows. VDD is provided to the P region 610*a*, 61 0*b*, through metal 1 M1 contacts 616*a*, 616*b* respectively. Similarly, VSS is provided to the N region 612*a*, 612*b*, through metal 1 M1 contacts 618*a* and 618*b* respectively. A search line (SL) contact 622 connects the polysilicon gate of P24 to metal 1 M1 and the bit-line interconnect pads 623a, 623b connect the diffusion of transistors N23 and N24 to metal layer 1 M1 and are formed on the respective upper and lower peripheral edges of The layout schematic. The match line and word line contacts 624a, 624b are located at respective upper and lower right corners of the layout schematic.

Referring now to FIG. 6b, there is shown the interconnections between a second metal layer M2 and the first metal layer M1, with the second metal M2 being overlaid on the first metal layer M1. Interconnects between the layer M1 to M2 are indicated by the rectangular cross-hatched regions 629, while the conductive regions of metal layer M2 are indicated by the thin solid line diagonally-hatched shaded regions. Primarily, this metal 2 M2 layer is used to provide VDD, 630a and VSS, 630b signals to the cell array.

Figure 6C:
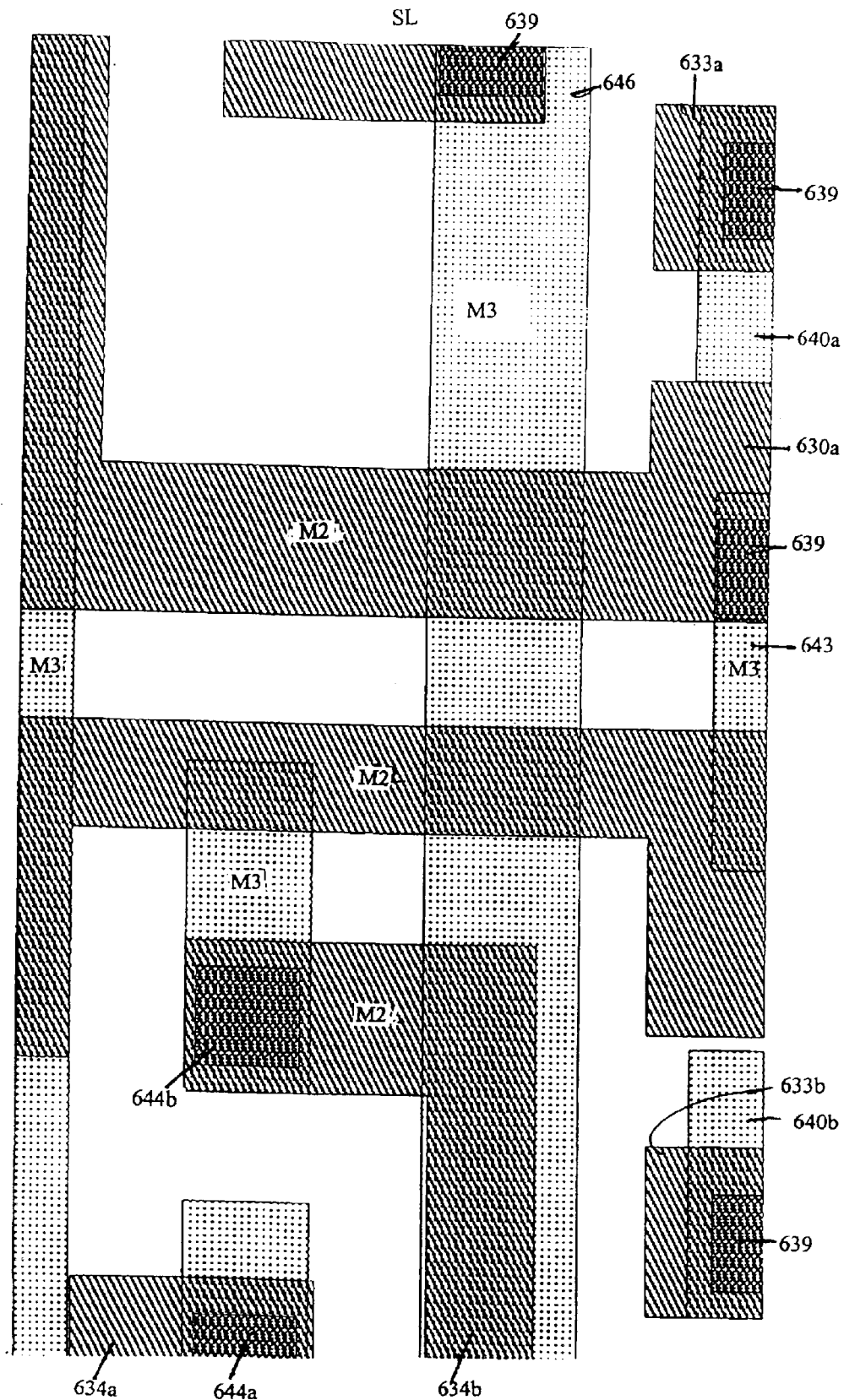

Referring now to FIG. 6c, there is shown a third metal layer M3 overlaid on The second metal layer M2, and indicated by stippled regions. Interconnects between the metal layer M2 and the metal layer M3 are indicated by diagonally hatched rectangular areas 639. The M3 layer primarily caries the search line 646 and Vdd. The remaining pads namely, the match line 633a, and word line 633b are connected to the M2 layer through vias to corresponding pads 640a, 640b respectively. Similarly, the bit lines on M2 634a, 634b are connected through vias to pads on M3 at 644a, 644bB, respectively. Vdd is also connected from layer M2 630a, through a via to a pad 643 on layer M3.

Figure 6D:
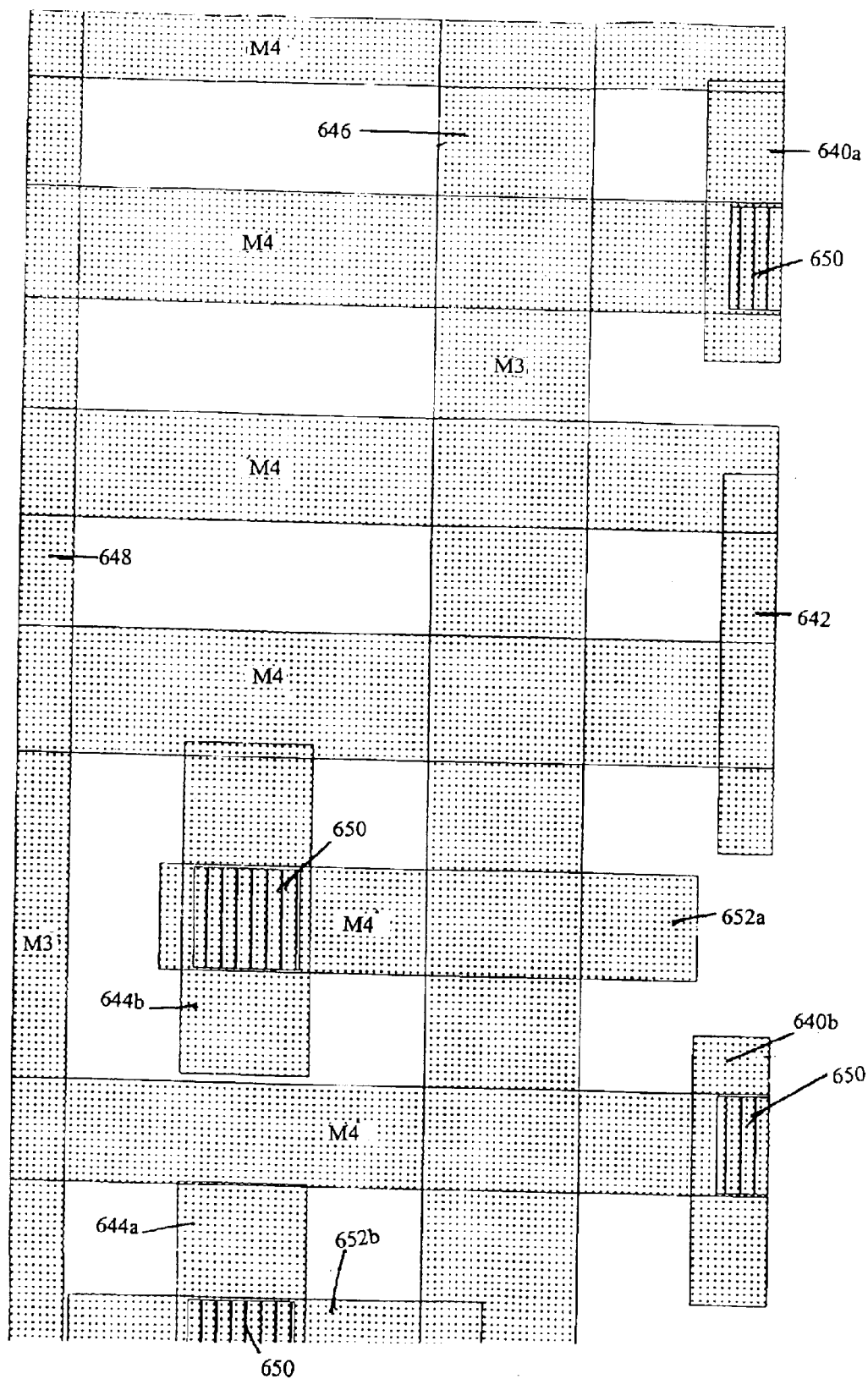

Referring now to FIG. 6d, there is shown the layout of the metal 4 layer M4 indicated by horizontally extending regions enclosed by lines, which are connected to the metal 3 layer M3 through metal vias shown by rectangular vertically-hatched regions 650.

Figure 6E:
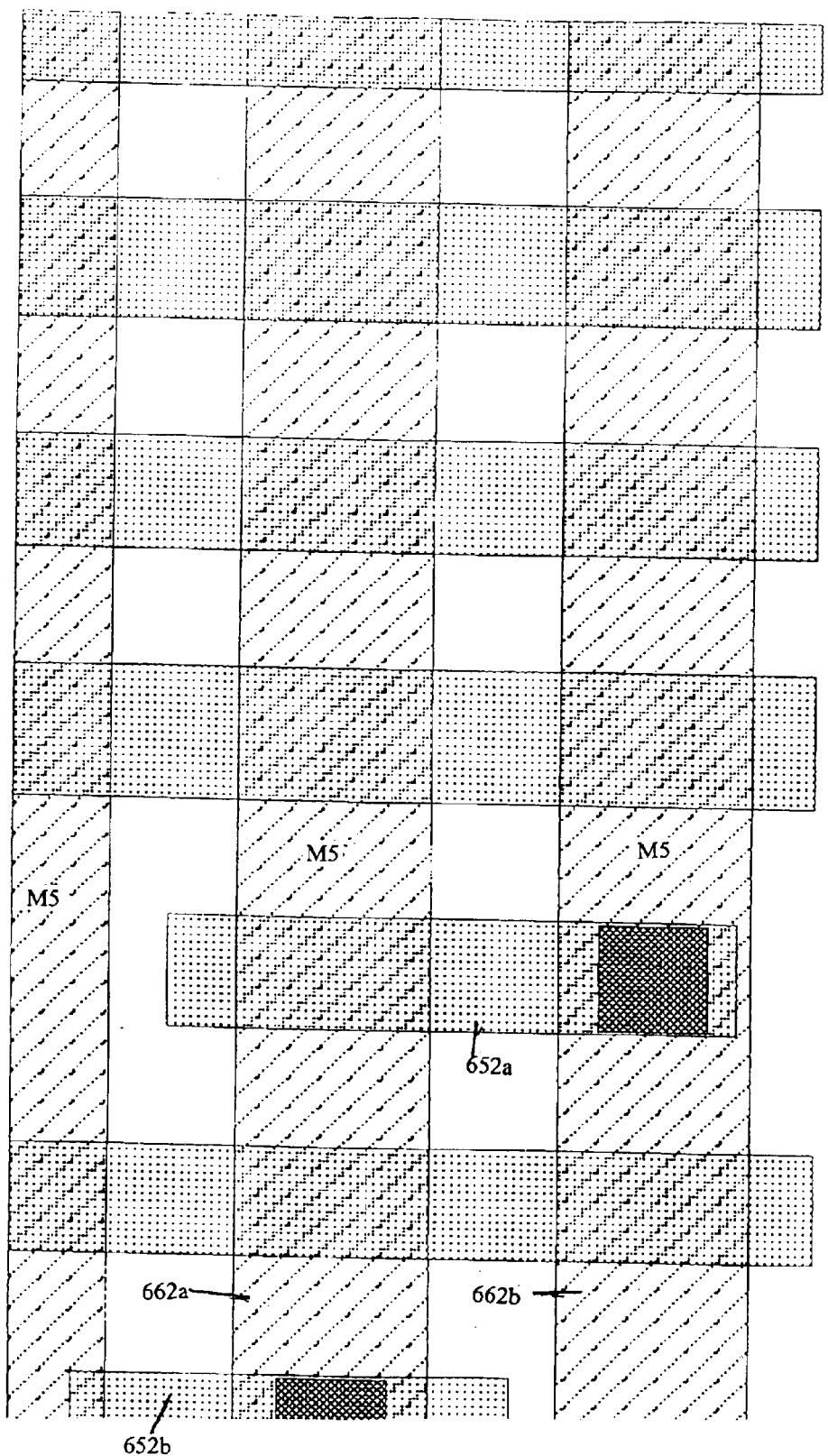

Referring to FIG. 6e, there is shown the metal 5 layer M5, indicated by diagonally hatched regions comprising bit lines BL 662a, BL\, 662b connected through vias to metal pads 652a, 652b, respectively on metal layer M4.

Figure 7:
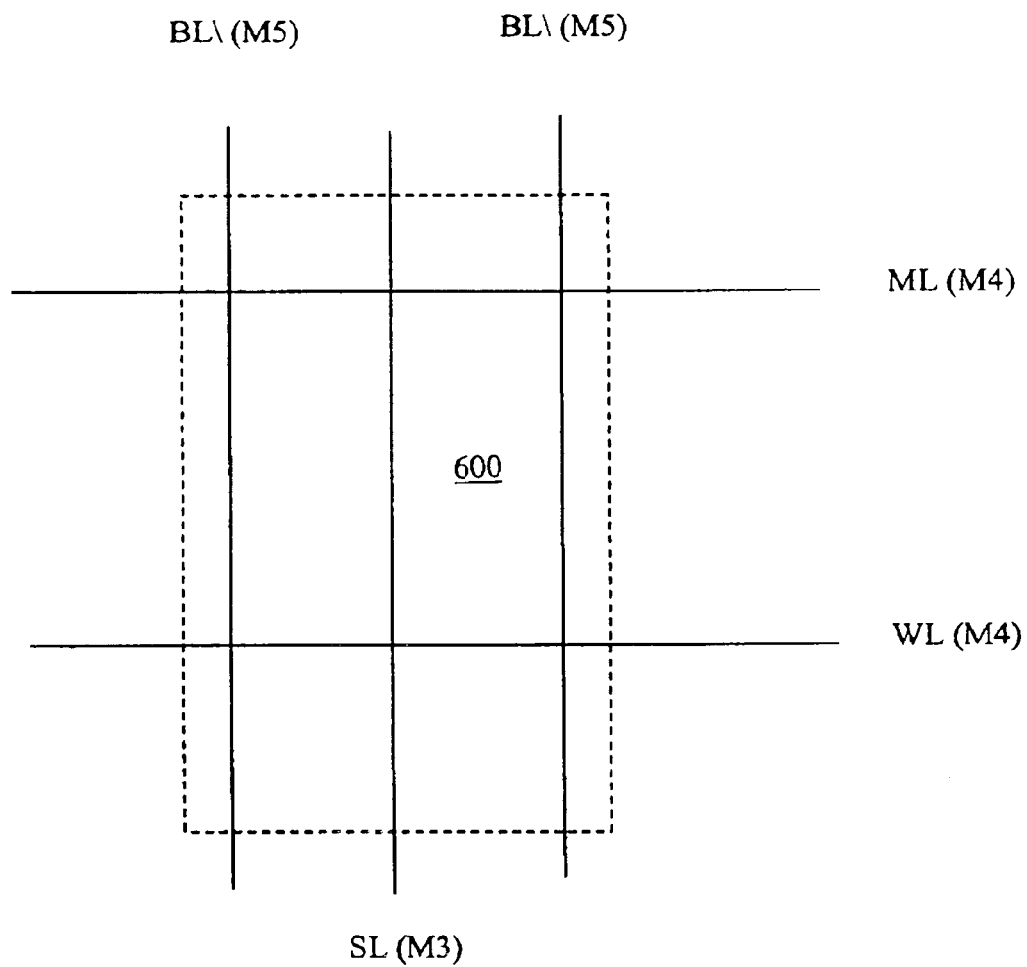
FIG. 7 is a schematic diagram showing the arrangement of signal lines in the layout of FIG. 6.

Referring to FIG. 7, there is shown a schematic diagram of the major signal lines and their respective layers. Thus it may be seen that for each half cell layer as described in FIG. 6, the bit lines BL and BL\ extend along opposite sides of the half cell on metal layer M5, with the search line extending therebetween on layer M3. The match line and the word line ML, WL, extend orthoganlly to the bit lines on layer M4.

Accordingly it may be seen that only one level of poly-silicon is used in this layout, with the signal and power lines formed in upper layer of metal. Thus the cell is more easily implemented using a straight "logic process". As is well known it is easier to create multiple layers of metal than multiple layers of poly-silicon.

Although the invention has been described with reference to specific embodiments, various modifications will become apparent to a person skilled in the art with departing from the spirit of the invention.

What is claimed is:

1. A content addressable memory (CAM) cell having a plurality of 6T ternary memory cells in a fabricated semiconductor material, each half of the CAM cell comprising:

an equal number of transistors of a p-type and an n-type, the p-type transistors being formed in a n-well region and the n-type transistors being formed in a p-well region of said semiconductor material, the p-wells being separated from the n-wells by at most one p+ to n+ region spacing, the transistors being interconnected to form said half CAM cell and wherein the interconnections between the half CAM cell are restricted to a first group of conductive layers and connections between said CAM cell and CAM signal lines external to said CAM cell are formed in a second group of conductive layers.

2. A CAM as defined in claim 1, said CAM signal lines external to said CAM cell include a search line, matchline, bitline and word line.

3. A CAM as defined in claim 2, said search line being formed in a third metal layer.

4. A CAM as defined in claim 3, said matchline and wordline being formed in a fourth metal layer.

5. A CAM as defined in claim 1, said bitline being formed in a fifth metal layer.

6. A CAM as defined in claim 1, said conductive layers include at least one polysilicon layer.

7. A content addressable memory (CAM), comprising:

(a) a plurality of half ternary CAM cells each having at least one 6T ternary memory cell and an equal number of transistors of a p-type and an n-type, the p-type transistors being formed in a first well region and the n-type transistors being formed in a second well region of a semiconductor material, the first well region being separated from the second well region by at most one p+ to n+ region spacing, the transistors being interconnected to form said half ternary CAM cell and wherein the interconnections are restricted to a silicon layer and a first metal layer;

(b) power lines formed in a second metal layer and coupled to said cells;

(c) a plurality of search lines formed in a third metal layer;

(d) a plurality of wordlines and match lines formed in a fourth metal layer; and (e) a plurality of bitlines formed in a fifth metal layer.

* * * * *